(12) United States Patent
Park et al.

(10) Patent No.: US 10,209,548 B2
(45) Date of Patent: Feb. 19, 2019

(54) DISPLAY APPARATUS HAVING A FLEXIBLE CIRCUIT BOARD

(71) Applicant: SAMSUNG DISPLAY CO., LTD., Yongin-si, Gyeonggi-Do (KR)

(72) Inventors: Seki Park, Hwaseong-si (KR); Jinhyuk Park, Hwaseong-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 9 days.

(21) Appl. No.: 15/605,092

(22) Filed: May 25, 2017

(65) Prior Publication Data
US 2018/0081232 A1     Mar. 22, 2018

(30) Foreign Application Priority Data
Sep. 19, 2016 (KR) .................. 10-2016-0119430

(51) Int. Cl.
| | |
|---|---|
| G02F 1/1333 | (2006.01) |
| G02F 1/1345 | (2006.01) |
| G02F 1/133 | (2006.01) |
| G02F 1/167 | (2006.01) |
| G02B 26/00 | (2006.01) |
| H01L 51/52 | (2006.01) |

(52) U.S. Cl.
CPC .... *G02F 1/133308* (2013.01); *G02F 1/13306* (2013.01); *G02B 26/005* (2013.01); *G02F 1/13452* (2013.01); *G02F 1/167* (2013.01); *G02F 2001/13456* (2013.01); *G02F 2001/133314* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 9,541,779 B2* | 1/2017 | Jeong | ............... H05K 1/028 |
| 2015/0310823 A1 | 10/2015 | Wang | |
| 2015/0316810 A1* | 11/2015 | Shibahara | ........... G02F 1/1333 349/150 |

(Continued)

FOREIGN PATENT DOCUMENTS

| | | |
|---|---|---|
| KR | 1020030088576 | 11/2003 |
| KR | 1020120021073 | 3/2012 |

(Continued)

*Primary Examiner* — Nathanael R Briggs
(74) *Attorney, Agent, or Firm* — F. Chau & Associates, LLC

(57) ABSTRACT

A display apparatus includes a display panel arranged substantially along a second direction. The display panel is curved in a first direction with a first degree of curvature. The second direction crosses the first direction. A first accommodating member receives the display panel. A plurality of flexible circuit boards is connected to one side portion of the display panel. A printed circuit board is connected to the flexible circuit boards. A beading portion is disposed on a lower portion of the first accommodating member. The printed circuit board is disposed on a lower portion of the beading portion. A lower surface of the beading portion includes a curved surface that is curved in the first direction with a second degree of curvature that is smaller than the first degree of curvature.

21 Claims, 10 Drawing Sheets

(56) References Cited

U.S. PATENT DOCUMENTS

| | | | |
|---|---|---|---|
| 2015/0373828 A1 | 12/2015 | Ye et al. | |
| 2016/0057872 A1 | 2/2016 | Park et al. | |
| 2016/0066442 A1* | 3/2016 | Kang | H05K 5/0017 |
| | | | 361/807 |
| 2016/0187709 A1 | 6/2016 | Lee et al. | |
| 2016/0255739 A1* | 9/2016 | Yoo | G02B 6/0045 |
| | | | 362/606 |
| 2017/0013704 A1* | 1/2017 | Kim | H05K 7/02 |

FOREIGN PATENT DOCUMENTS

| | | |
|---|---|---|
| KR | 1020150028791 | 3/2015 |
| KR | 1020160022435 | 3/2016 |
| KR | 1020160071533 | 6/2016 |

\* cited by examiner

DISPLAY APPARATUS HAVING A FLEXIBLE CIRCUIT BOARD

CROSS-REFERENCE TO RELATED APPLICATION

This U.S. non-provisional patent application claims priority under 35 U.S.C. § 119 to Korean Patent Application No. 10-2016-0119430, filed on Sep. 19, 2016, the contents of which are hereby incorporated by reference in its entirety.

TECHNICAL FIELD

The present disclosure relates to a display apparatus. More particularly, the present disclosure relates to a display apparatus having a flexible circuit board.

DISCUSSION OF THE RELATED ART

In general, a display apparatus includes a display panel displaying an image and a backlight unit providing the display panel with a light. The display panel includes a first substrate including a plurality of pixels disposed thereon, a second substrate disposed to face the first substrate, and an image display layer disposed between the first and second substrates.

The image display layer is driven by the pixels, and a transmittance of the light therethrough is controlled by the image display layer, thereby displaying the image. The image display layer may be a liquid crystal layer, an electrowetting layer, or an electrophoretic layer. Where the display apparatus does not include the backlight unit, the image display layer may be an organic light emitting layer including organic light emitting devices. The display apparatus is generally manufactured in a flat shape, but recently, display apparatuses having curved shapes have been developed.

SUMMARY

A display apparatus includes a display panel arranged substantially along a second direction. The display panel is curved in a first direction with a first degree of curvature. The second direction crosses the first direction. A first accommodating member receives the display panel. A plurality of flexible circuit boards is connected to one side portion of the display panel. A printed circuit board is connected to the flexible circuit boards. A beading portion is disposed on a lower portion of the first accommodating member. The printed circuit board is disposed on a lower portion of the beading portion. A lower surface of the beading portion includes a curved surface that is curved in the first direction with a second degree of curvature that is smaller than the first degree of curvature.

A display apparatus includes a curved display panel. One or more flexible circuit boards is disposed on the curved display panel. A printed circuit board is disposed on the one or more flexible circuit boards such that the one or more flexible circuit boards disposed between the curved display panel and the printed circuit board. A beading portion is disposed between the curved display panel and the printed circuit board. The beading portion is curved on a first surface thereof to an extent that exceeds an extent to which a second surface thereof is curved.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
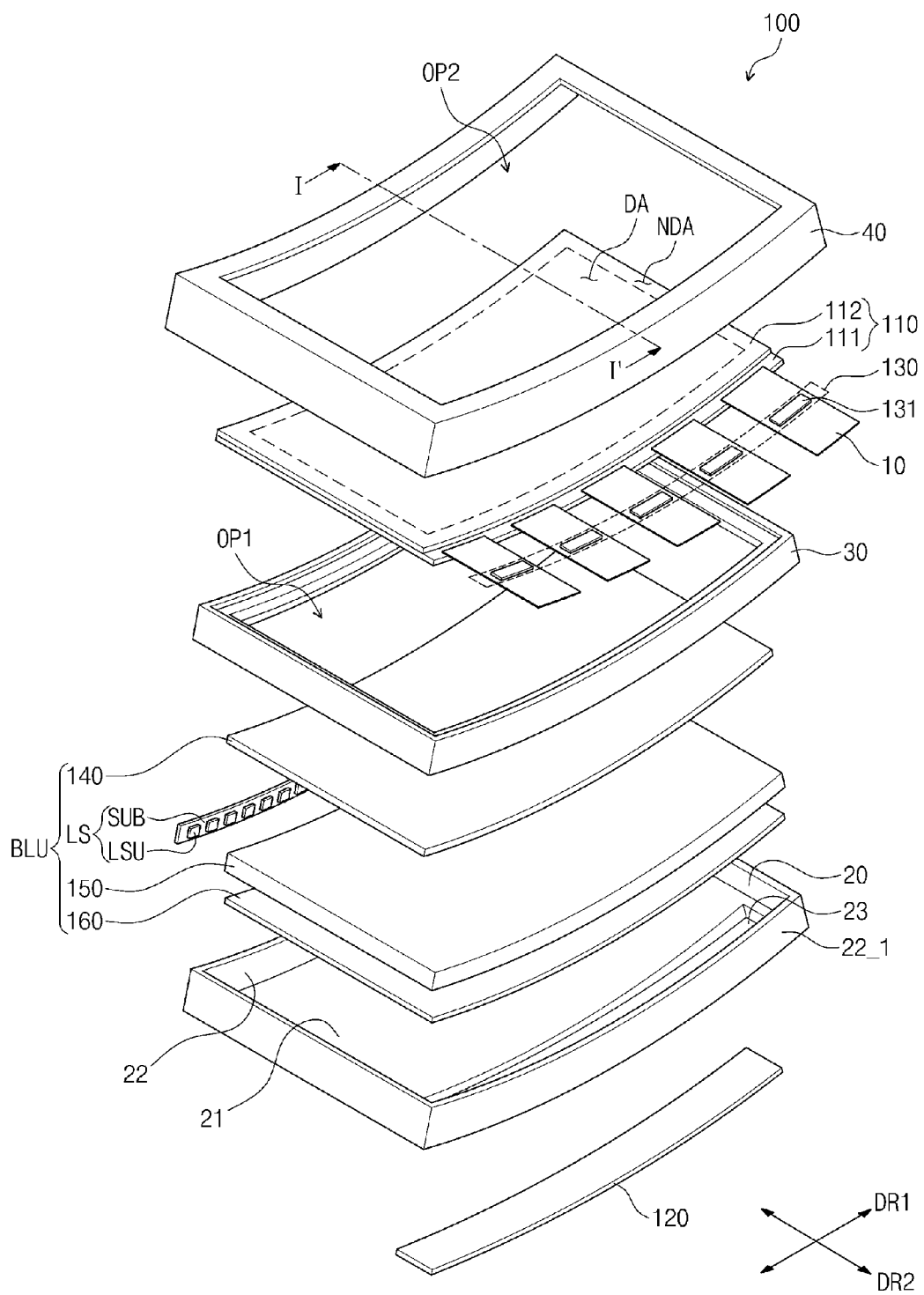
FIG. 1 is a perspective view illustrating a display apparatus according to an exemplary embodiment of the present disclosure.

Hereinafter, exemplary embodiments of the present invention will be explained in detail with reference to the accompanying drawings. The present disclosure and methods of accomplishing the same may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be thorough and complete and will fully convey the concept of the invention to those skilled in the art. Like numbers may refer to like elements throughout the specification and the drawings.

It will be understood that when an element or layer is referred to as being "on", "connected to" or "coupled to" another element or layer, it can be directly on, connected or coupled to the other element or layer or intervening elements or layers may be present.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms, e.g., first, second, etc. may be used herein to describe various elements, components, regions, layers and/or sections, these elements, components, regions, layers and/or sections, these terms are only used to distinguish one element, component, region, layer or section from another region, layer or section. Thus, a first element, component, region, layer or section discussed below could be termed a second element, component, region, layer or section without departing from the teachings of the present invention.

Embodiments described in the disclosure are described with reference to plan views and cross-sectional views that are ideal schematic diagrams. Accordingly, shapes of the exemplary views may vary depending on manufacturing technologies and/or tolerances. Thus, embodiments of the present disclosure may include variations in form produced according to manufacturing processes. Therefore, regions illustrated in the drawings are exemplary.

Hereinafter, the present invention will be explained in detail with reference to the accompanying drawings.

FIG. 1 is a perspective view illustrating a display apparatus 100 according to an exemplary embodiment of the present disclosure.

Referring to FIG. 1, the display apparatus 100 may be a curved surface display apparatus 100 curved in a first direction DR1 and parallel to a second direction DR2 crossing the first direction DR1.

The display apparatus 100 includes a display panel 110 displaying an image using a light. A backlight unit BLU generates the light and provides the light to the display panel 100. Accommodating members 20, 30, and 40 receive and house the display panel 110 and the backlight unit BLU. The backlight unit BLU is disposed at a rear side of the display panel 110 and provides the light to the display panel 110.

The display panel 110 includes a display area DA through which the image is displayed and a non-display area NDA disposed adjacent to the display area DA. The display panel 110 may be a curved surface display panel that is curved in the first direction DR1 at a first curvature and parallel to the second direction DR2. The display panel 110 is convex-curved downwardly in the first direction DR1 with respect to a surface defined by the first direction DR1 and the second direction DR2.

The display panel 110 may have a rectangular shape defined by two long sides extending in the first direction DR1 and facing each other in the second direction DR2 and two short sides extending in the second direction DR2 from opposite ends of the long sides and facing each other in the first direction DR1.

The display panel 110 is substantially curved with the first curvature being in respect to the first direction DR1. The first curvature is curved by applying a predetermined force to the display panel 110 while in the flat state. The curved display panel 110 may be fixed to the accommodating members 20, 30, and 40 after being set within the accommodating members 20, 30, and 40. To accommodate the display panel 110, the accommodating members 20, 30, and 40 may be manufactured to be curved with the first curvature with respect to the first direction DR1.

The display panel 110 includes a plurality of pixels displaying the image. The pixels are connected to a plurality of gate lines extending in the first direction DR1 and a plurality of data lines extending in the second direction DR2. The pixels receive data voltages through the data lines in response to gate signals provided through the gate lines and display grayscales corresponding to the data voltages.

Each pixel may display a primary color. The primary colors of the pixels may include red, green, and blue colors, but they should not be limited thereto or thereby. For example, the primary colors may further include various colors, e.g., a white color, a yellow color, a cyan color, a magenta color, etc.

The display panel 110 may be, but is not limited to, a liquid crystal display panel including a liquid crystal layer. For example, the display panel 110 includes a first substrate 111 including the pixels arranged thereon, a second substrate 112 facing the first substrate 111, and the liquid crystal layer interposed between the first substrate 111 and the second substrate 112. However, an electrowetting display panel including an electrowetting layer, an electrophoretic display panel including an electrophoretic layer, or an organic light emitting display panel including organic light emitting devices may be employed as the display panel 110.

The display apparatus 100 includes a driving part 130 driving the display panel 110, a plurality of flexible circuit boards 10 upon each of which the driving part 130 is mounted, and a printed circuit board 120 applying control signals and image signals to the driving part 130. The driving part 130 may be referred to as a data driver.

The driving part 130 includes a plurality of driving chips 131. The driving chips 131 may each be connected to one side of the display panel 110 through the flexible circuit boards 10. The one side of the display panel 110 is curved in the first direction DR1, with respect to the second direction DR2. The one side of the display panel 110 corresponds to one of the long sides of the display panel 110. The flexible circuit boards 10 on which the driving chips 131 are mounted may be connected to one side of the first substrate 111 that is curved in the first direction DR1.

The flexible circuit boards 10 are arranged in the first direction DR1. The printed circuit board 120 is connected to the flexible circuit boards 10 to apply the control signals and the image signals to the driving part 130. The printed circuit board 120 is curved in the first direction DR1 having a second curvature that is smaller than the first curvature. The printed circuit board 120 is disposed primarily along the second direction DR2.

Figure 3:
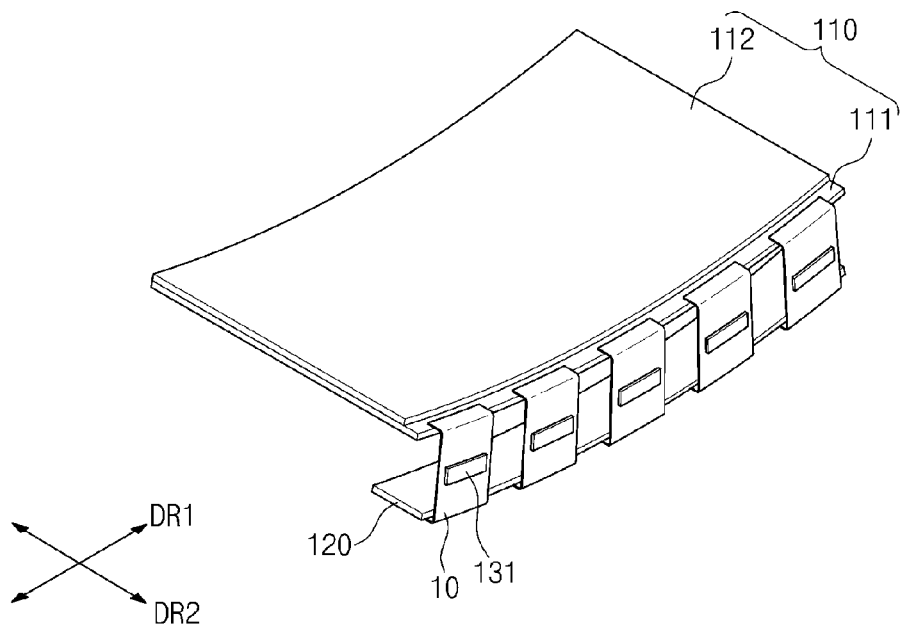
FIG. 3 is a perspective view illustrating a connection state between a printed circuit board and flexible circuit boards shown in FIG. 1 according to an exemplary embodiment of the present disclosure.
Figure 4:
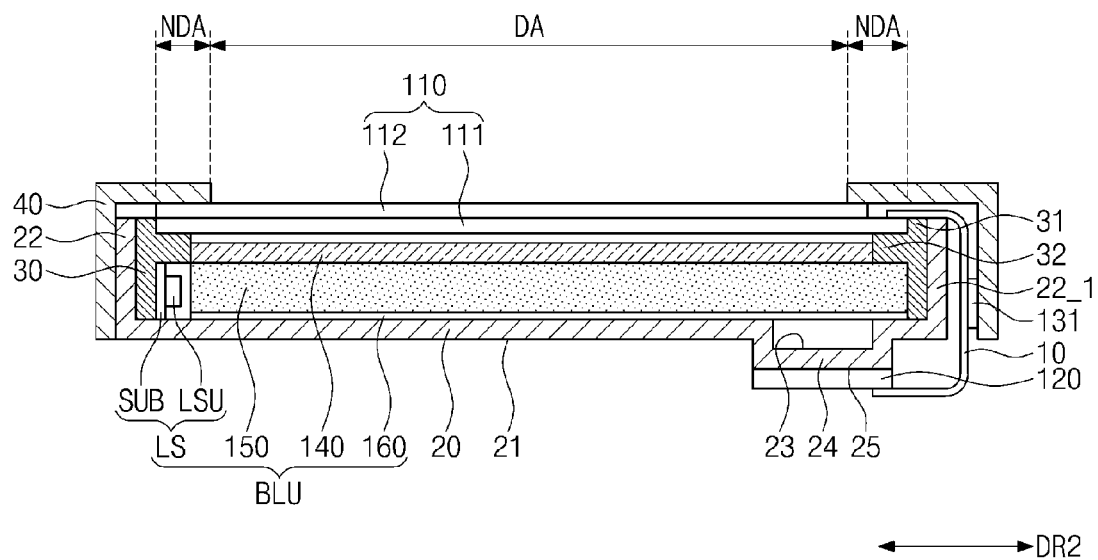
FIG. 4 is a cross-sectional view taken along a line I-I' show in FIG. 1.

For the convenience of explanation, the printed circuit board 120 is separated from the flexible circuit boards 10 as shown in FIG. 1, but in FIGS. 3 and 4, the printed circuit board 120 and the flexible circuit boards 10 will be shown in a connected state.

The driving chips 131 receive the control signals and the image signals from the printed circuit board 120 and generate the data voltages corresponding to the image signals in response to the control signals. The data voltages may be provided to the pixels through the above-mentioned data lines.

A gate driver may be disposed at one side of the first substrate 111 with respect to the first direction DR1. The gate driver generates the gate signals, and the gate signals are provided to the pixels through the gate lines. The gate driver may be formed substantially simultaneously with transistors of the pixels through the same process and mounted on the first substrate 111 in an amorphous silicon TFT gate driver circuit (ASG) form or an oxide silicon TFT gate driver circuit (OSG) form.

The backlight unit BLU may be, but is not limited to being, an edge type backlight unit. The backlight unit BLU includes an optical sheet 140, a light guide plate 150, a light source LS, and a reflective sheet 160. The optical sheet 140, the light guide plate 150, the light source LS, and the reflective sheet 160 are curved in the first direction DR1 so as to have the first curvature and be curved substantially parallel to the second direction DR2.

The light guide plate 150 may have a rectangular shape defined by two long sides extending in the first direction DR1 and facing each other in the second direction DR2 and two short sides extending in the second direction DR2 from opposite ends of the long sides and facing each other in the first direction DR1. The light source LS is disposed adjacent to one side of the light guide plate 150 with respect to the second direction DR2. The printed circuit board 120 is disposed adjacent to the other side of the light guide plate 150, with respect to the second direction DR2.

The one side of the light guide plate 150 may be one of the long sides of the light guide plate 150, with respect to the second direction DR2, and the other side of the light guide plate 150 may be the other long side of the light guide plate 150, with respect to the second direction DR2. According to an exemplary embodiment of the present disclosure, the light source LS is disposed adjacent to the one long side of the long sides of the light guide plate 150, but the position of the light source LS is not limited thereto. For example, the light source LS may be disposed adjacent to one of the short sides of the light guide plate 150. For example, the light source LS may be disposed adjacent to one side of the light guide plate 150, at which the printed circuit board 120 is not disposed.

The reflective sheet 160 is disposed under the light guide plate 150, and the optical sheet 140 is disposed over the light guide plate 150. The display panel 110 is disposed over the light guide plate 150.

The light source LS generates the light used in the display panel 110. The light generated by the light source LS is provided to the one side of the light guide plate 150 in the second direction DR2. The one side of the light guide plate 150 may be referred to as a light incident part. The light guide plate 150 changes a direction of the light, in which the light from the light source LS travels, to an upward direction in which the display panel 110 is disposed.

The light source LS includes a light source substrate SUB that is curved in the first direction DR1 at the first curvature and a plurality of light source units LSU mounted on the light source substrate SUB. The light source units LSU are arranged in the first direction DR1 at regular intervals. The light source units LSU are arranged to face one side surface of the light guide plate 150 in the second direction DR2. Each of the light source units LSU generates the light, and the light generated by the light source units LSU is provided to the one side surface of the light guide plate 150.

The reflective sheet 160 reflects the light leaked downward from the light guide plate 150 in an upward direction. The optical sheet 140 may include a diffusion sheet and a prism sheet disposed on the diffusion sheet. The diffusion sheet diffuses the light from the light guide plate 150.

The prism sheet condenses the light diffused by the diffusion sheet in an upward direction substantially vertical to a plane defined by the first direction DR1 and the second direction DR2. The light travels in the upward direction after passing through the prism sheet and is provided to the display panel 110 with a uniform brightness.

A first accommodating member 20 houses the backlight unit BLU and the display panel 110. A second accommodating member 30 supports the display panel 110. A third accommodating member 40 covers the non-display area NDA of the display panel 110. The first accommodating member 20, the second accommodating member 30, and the third accommodating member 40 may be referred to as a bottom chassis, a mold frame, and a top chassis, respectively. The first, second, and third accommodating members 20, 30, and 40 are each curved in the first direction DR1 at the first curvature and are each substantially parallel to the second direction DR2.

The first accommodating member 20 includes a bottom portion 21 that is curved in the first direction DR1 at the first curvature and extends parallel to the second direction DR2. The first accommodating member 20 also includes sidewalk 22 extending upward from side surfaces of the bottom portion 21. The bottom portion 21 serves as a lower surface of the first accommodating member 20, and the sidewalls 22 serve as side surfaces of the first accommodating member 20.

The bottom portion 21 may have a rectangular shape defined by long sides in the first direction DR1 and short sides in the second direction DR2. The bottom portion 21 is convexly curved downward from the plane defined by the first direction DR1 and the second direction DR2 with respect to the first direction DR1. The backlight unit BLU and the display panel 110 may be disposed in a space defined by the bottom portion 21 and the sidewalls 22.

The sidewall 22 extending from one long side of the bottom portion 21 is referred to as a first sidewall 22_1. A recess 23 is formed in the bottom portion 21 by recessing downwardly a predetermined area of an upper surface of the bottom portion 21 adjacent to the first sidewall 22_1. A beading portion protruded from a predetermined area of a lower surface of the bottom portion 21 adjacent to the first sidewall 22_1 is disposed at the bottom portion 21, and the printed circuit board 120 is disposed under the beading portion. These structures will be described in additional detail below with reference to FIGS. 3 to 5.

The second accommodating member 30 is disposed between the display panel 110 and the backlight unit BLU and has a rectangular frame shape. The second accommodating member 30 is disposed corresponding to the non-display area NDA of the display panel 110 to support an edge portion of the display panel 110. The edge portion of the display panel 110, which corresponds to a border area, may be a predetermined area of the non-display area NDA of the display panel 110. The second accommodating member 30 includes a first opening OP1 defined therethrough to expose the display area DA of the display panel 110.

The third accommodating member 40 has a rectangular frame shape and includes a second opening OP2 defined therethrough to expose the display area DA of the display panel 110. The third accommodating member 40 may cover the non-display area NDA of the display panel 110.

Figure 2:
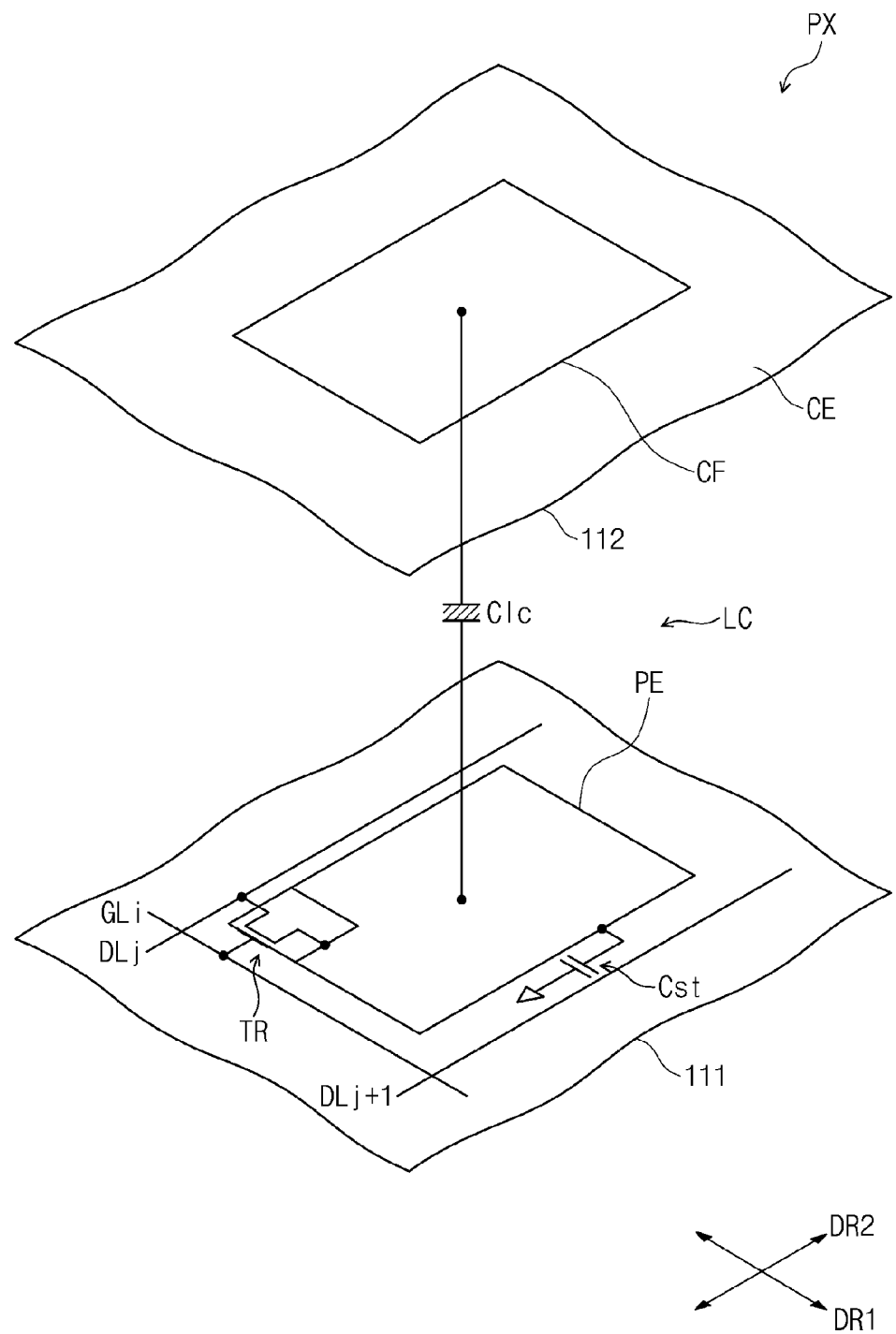
FIG. 2 is a circuit diagram illustrating a pixel of a display panel shown in FIG. 1 according to an exemplary embodiment of the present disclosure.

FIG. 2 is a circuit diagram illustrating a pixel of a display panel shown in FIG. 1.

For the convenience of explanation, FIG. 2 shows a pixel PX connected to a gate line GLi and a data line DLj, and other pixels of the display panel 110 may be understood to have the same configuration as that of the pixel PX.

Referring to FIG. 2, the display panel 110 includes the first substrate 111, the second substrate 112 facing the first substrate 111, and the liquid crystal layer LC disposed between the first substrate 111 and the second substrate 112. The pixel PX includes a transistor TR connected to the gate line GLi and the data line DLj, a liquid crystal capacitor Clc connected to the transistor TR, and a storage capacitor Cst connected to the liquid crystal capacitor Clc in parallel. The storage capacitor Cst may be omitted. Here "i" and "j" may each represent a positive integer.

The transistor TR may be disposed on the first substrate 111. The transistor TR includes a gate electrode connected to the gate line GLi, a source electrode connected to the data line DLj, and a drain electrode connected to the liquid crystal capacitor Clc and the storage capacitor Cst.

The liquid crystal capacitor Clc includes a pixel electrode PE disposed on the first substrate 111, a common electrode CE disposed on the second substrate 112, and the liquid crystal layer LC interposed between the pixel electrode PE and the common electrode CE. The liquid crystal layer CL serves as a dielectric substance. The pixel electrode PE is connected to the drain electrode of the transistor TR.

In FIG. 2, the pixel electrode PE is illustrated as having a non-slit structure, but the pixel electrode PE may have a different structure. For example, the pixel electrode PE may have a slit structure defined by a trunk portion with a cross shape and a plurality of branch portions extending from the trunk portion in a radial direction.

The common electrode CE may be disposed over the second substrate 112, however, the common electrode CE may be differently disposed. For example, the common electrode CE may be disposed on the first substrate 111. In this case, at least one of the pixel electrode PE and the common electrode CE may have slits.

The storage capacitor Cst may include the pixel electrode PE, a storage electrode branched from a storage line, and an insulating layer disposed between the pixel electrode PE and the storage electrode. The storage line may be disposed on the first substrate 111 and may be formed substantially simultaneously with the gate lines GL1 to GLm on the same layer. The storage line may partially overlap the pixel electrode PE.

The pixel PX may further include a color filter CF that is red, green, or blue. As an example, the color filter CF may be disposed on the second substrate 112 as shown in FIG. 2. However, the color filter CF may be disposed on the first substrate 111 according to exemplary embodiments of the present invention.

The transistor TR is turned on in response to the gate signal provided thereto through the gate line GLi. The data voltage provided through the data line DLj is applied to the pixel electrode PE of the liquid crystal capacitor Clc through the turned-oar transistor TR. The common voltage is applied to the common electrode.

An electric field is generated between the pixel electrode PE and the common electrode CE due to a difference in voltage level between the data voltage and the common voltage. Liquid crystal molecules of the liquid crystal layer LC are driven due to the electric field generated between the pixel electrode PE and the common electrode CE. A light transmittance of the liquid crystal layer LC is controlled by the liquid crystal molecules driven by the electric field, and thus the desired image is displayed.

A storage voltage having a constant voltage level may be applied to the storage line, however, the common voltage may alternatively be applied to the storage line according to some exemplary embodiments of the present disclosure. The storage capacitor Cst complements the voltage charged in the liquid crystal capacitor Clc.

FIG. 3 is a perspective view illustrating a connection state between a printed circuit board and flexible circuit boards shown in FIG. 1.

Referring to FIG. 3, one side portions of the flexible circuit boards 10, on which the driving chips 131 are respectively mounted, are connected to the one side portion of the first substrate of the display panel 110 having a curved surface. The other side portions of the flexible circuit boards 10 are connected to the printed circuit board 120. The flexible circuit boards 10 may electrically connect the driving chips 131, the printed circuit board 120, and the display panel 110.

The flexible circuit boards 10 are bent, and the printed circuit board 120 connected to the flexible circuit boards 10 is disposed under the display panel 10. The printed circuit board 120 is disposed under the first accommodating member 20.

FIG. 4 is a cross-sectional view taken along a line I-I' show in FIG. 1.

Referring to FIG. 4, the backlight unit BLU and the display panel 110 are accommodated in the first accommodating member 20 as described above. For example, the reflective sheet 160, the light guide plate 150, the optical sheet 140, and the first substrate 111 of the display panel 110 may be disposed within the first accommodating member 20. The first sideswall 22_1 corresponds to the sidewall adjacent to the side portion of the display panel 110 and connected to the flexible circuit boards 10 among the sidewalls 22.

The accommodating members 20, 30, and 40 include the beading portion 24 protruded downward from the predetermined area of the lower surface of the bottom portion 21 adjacent to the sidewall 22_1. The recess 23 is disposed to correspond to the beading portion 24. For example, when the beading portion 24 is formed, the recess 23 may be defined in the bottom portion 21 in an area corresponding to the beading portion 24. The beading portion 24 may be integrally formed with the first accommodating member 20 and include a metal material. For example, the beading portion 24 and the first accommodating member 20 may be instantiated as a single continuous part.

The sidewalls 22 of the first accommodating member 20 may be disposed to surround an edge of the second accommodating member 30. The second accommodating member 30 includes a first extension portion 31 disposed along inner side surfaces of the sidewalls 22 and a second extension portion 32 extending from and vertical to a predetermined area of an inner side surface of the first extension portion 31.

The first extension portion 31 extends in a direction crossing a plane surface substantially parallel to the first and second directions DR1 and DR2. The light source LS may be disposed adjacent to the inner side surface of the first extension portion 31 facing one side surface of the light guide plate 150 adjacent to the light source LS under the first extension portion 31.

Since the edge portion of the display panel 110 is disposed above the second extension portion 32, the display panel 110 may be supported by the second accommodating member 30. For example, the first substrate 111 is disposed on the second extension portion 32, and the side surface of the first substrate 111 is disposed adjacent to the inner side surface of the first extension portion 31 above the second extension portion 32. As a result, the edge portion of the first substrate 111 may be supported by the second accommodating portion 30.

The second substrate 112 of the display panel 110 is disposed so as to allow a lower surface of the second substrate 112 to match with an upper surface of the second accommodating member 30 or the second substrate 112 may be disposed above the second accommodating member 30. The first substrate 111 is longer than the second substrate 112 in the second direction DR2. The flexible circuit boards 10 are connected to the one side portion of the first substrate 111, which is not overlapped with the second substrate 112.

The flexible circuit boards 10 are bent along the upper surface of the second accommodating member 30 adjacent to the first sidewall 22_1 and an outer side surface of the first sidewall 22_1 to be disposed under the bottom portion 21 adjacent to the first sidewall 22_1. The printed circuit board 120 connected to the flexible circuit hoards 10 is disposed at a position lower than the bottom portion 21 of the first accommodating member 20 since the flexible circuit boards 10 are bent.

The printed circuit hoard 10 is disposed under the beading portion 24 and attached to a lower surface of the beading portion 24 by an adhesive member 25. Although not shown in figures, a cover may be disposed under the first accommodating portion 20 to cover the printed circuit board 120 disposed at the beading portion 24. The cover is disposed to cover the printed circuit board 120 and connected to the first accommodating member 20 by a screw.

The third accommodating member 40 is disposed to cover the non-display area NDA of the display panel 110 and the third accommodating member 40 surrounds the sidewalls 22 of the first accommodating member 20.

Figure 5:
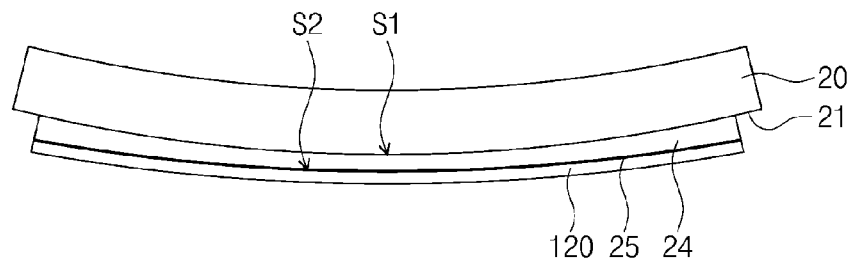
FIG. 5 is a side view illustrating a first accommodating part when viewed in a second direction according to an exemplary embodiment of the present disclosure.
Figure 6:
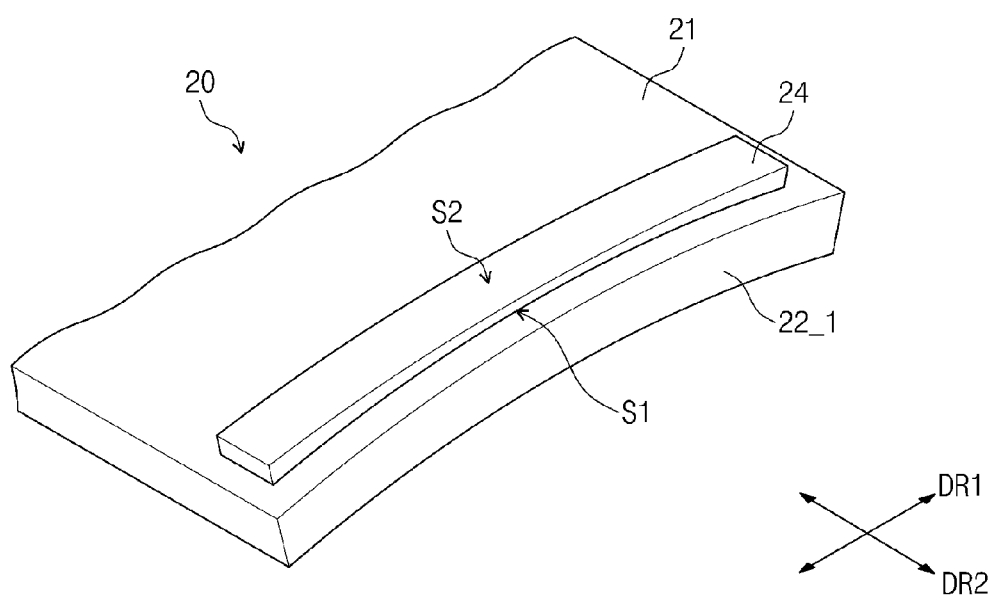
FIG. 6 is a perspective view illustrating an inverted state of the first accommodating part showing a configuration of a beading portion according to an exemplary embodiment of the present disclosure.
Figure 7:
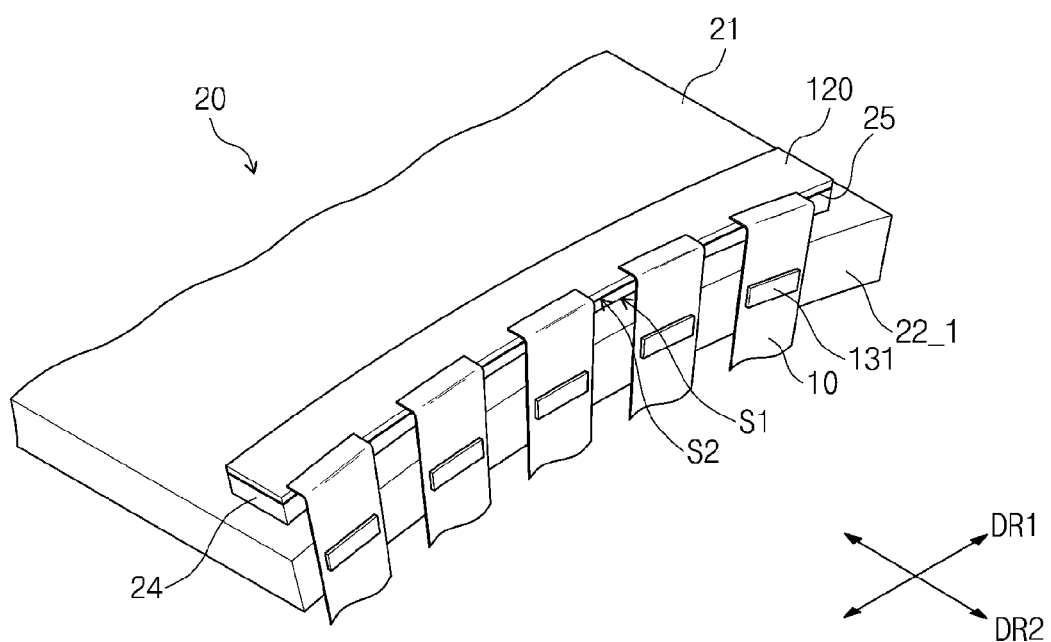
FIG. 7 is a perspective view illustrating the beading portion to which a printed circuit board is attached according to an exemplary embodiment of the present disclosure.

FIG. 5 is a side view illustrating a first accommodating part when viewed in a second direction. FIG. 6 is a perspective view illustrating an inverted state of the first accommodating part to show a configuration of a beading portion. FIG. 7 is a perspective view illustrating the heading portion to which a printed circuit board is attached.

In FIGS. 6 and 7, an upper surface S1 and a lower surface S2 of the beading portion 24 are shown in a state opposite to that shown in FIG. 5, however, it is to be understood that the terms "upper" and "lower" are relative and are used merely to distinguish between multiple surfaces and these terms are not to be understood to limit the invention. For the convenience of explanation, FIG. 5 illustrated only the printed circuit hoard 120 attached to the beading portion 24, and the flexible circuit boards 10 are omitted.

Referring to FIGS. 5, 6, and 7, the beading portion 24 and the printed circuit board 120 are convexly curved downward from the plane surface defined by the first direction DR1 and the second direction DR2. The heading portion 24 includes the upper surface S1 connected to the bottom portion 21 of the first accommodating member 20 and the lower surface S2, opposite to the upper surface S1, of the beading portion 24. The flexible circuit boards 10 are connected to the lower surface of the printed circuit board 120.

The upper surface S1 of the beading portion 24 is curved in the first direction DR1, with the first curvature on the bottom portion 21. The lower surface S2 of the beading portion 24 is curved in the first direction DR1 with the second curvature that is smaller than the first curvature. For example, the lower surface S2 of the beading portion 24 is more gently curved than the upper surface S1 of the beading portion 24.

The flexible circuit boards 10 are connected to the printed circuit hoard 120 in a flat state, and the printed circuit board 120 is curved by a predetermined force applied thereto to be attached to the heading portion 24. Where the flexible circuit boards 10 are connected to the lower surface of the printed circuit board 120 and the printed circuit board 120 is convexly and downwardly curved, the lower surface of the printed circuit board 120 is elongated, and thus a stress may occur in the flexible circuit boards 10. The stress may increase as the printed circuit board 120 is curved.

In the case that the printed circuit board 120 is curved with the first curvature that is the same as that of the bottom portion 21 and the lower surface of the beading portion 24 is curved with the first curvature, the stress occurring in the flexible circuit boards 10 increases, and thus the flexible circuit boards 10 connected to the lower surface of the printed circuit board 120 may be out of alignment.

According to exemplary embodiments of the present disclosure, the printed circuit board 120 is curved with the second curvature that is smaller than the first curvature and is disposed on the lower surface S2 of the beading portion 24 that is curved with the second curvature. Since the curvature of the printed circuit board 120 decreases, the stress occurring in the flexible circuit boards 10 disposed on the lower surface of the printed circuit board 120 may be reduced. Due to the reduction of the stress, the flexible circuit boards 10 may be prevented from being out of alignment.

FIGS. 8 to 13 are perspective views illustrating various beading portion according to exemplary embodiments of the present disclosure.

FIGS. 8 to 13 show the first accommodating member 20 in the inverted state, as it is shown in FIG. 6, and for the convenience of explanation, the beading portion and the printed circuit board are shown to be separated from each other. Hereinafter, different features of the beading portions shown in FIGS. 8 to 13 from those of the beading portion 24 shown in FIG. 6 will be primarily described, and detailed descriptions of same elements as described in the above embodiment will be omitted or mentioned briefly.

Figure 8:
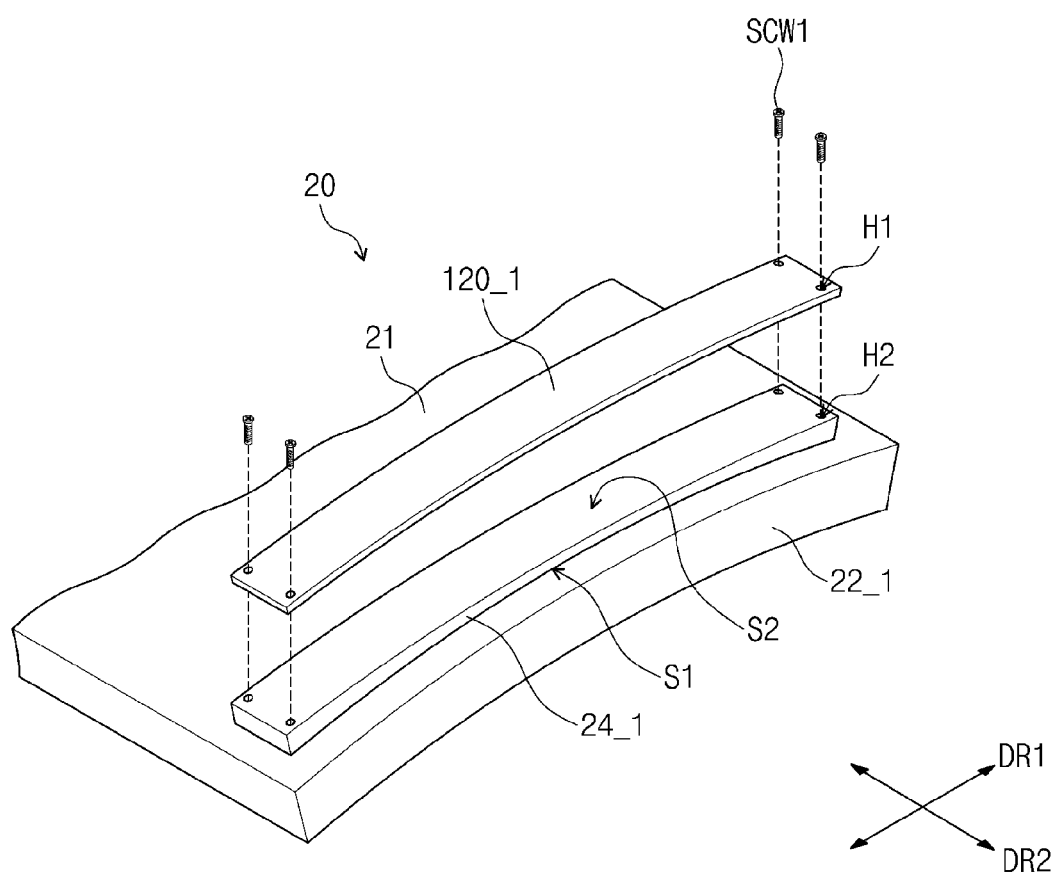
FIGS. 8 to 13 are perspective views illustrating various beading portions according to exemplary embodiments of the present disclosure.

Referring to FIG. 8, a display apparatus may include a plurality of first coupling members SCW1 to couple a printed circuit board 120_1 to a beading portion 24_1. The printed circuit board 120_1 may be coupled to the beading portion 24_1 by the first coupling members SCW1. In the present exemplary embodiment, the first coupling members SCW1 may include screws.

A plurality of first holes H1 is defined through predetermined areas of the printed circuit board 120_1, which are adjacent to opposite side portions of the printed circuit board 120_1 with respect to the first direction DR1. A plurality of second holes H2 is defined through predetermined areas of the beading portion 24_1, which are adjacent to opposite side portions of the beading portions 24_1 with respect to the first direction DR1. The second holes H2 are disposed to overlap with the first holes H1. The first coupling members SCW1 are inserted into the first holes H1 and the second holes H2 to couple the printed circuit board 120_1 to the beading portion 24_1.

Figure 9:
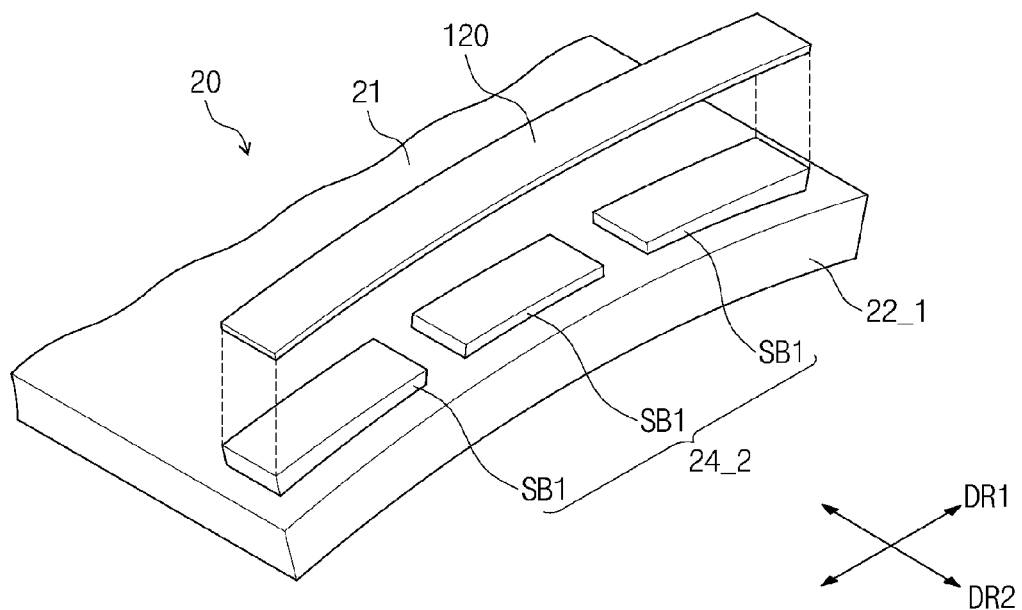

Referring to FIG. 9, a beading portion 24_2 includes a plurality of first sub-beading portions SB1 arranged in the first direction DR1. As an example, FIG. 9 shows three first sub-heading portions SB1, but the number of the first sub-beading portions SB1 should not be limited to three. For example, may be at least two first sub-beading portions SB1.

The printed circuit board 120 may be disposed on the first sub-beading portions SB1. The printed circuit hoard 120 may be attached to the first sub-beading portions SB1 by double-sided tapes.

Figure 10:
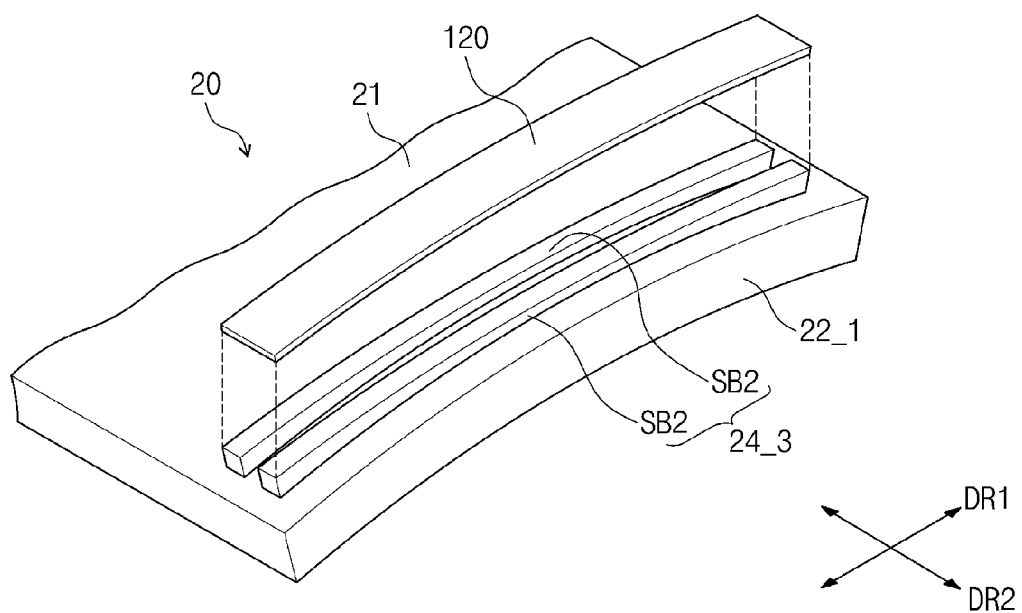

Referring to FIG. 10, a beading portion 24_3 includes a plurality of second sub-beading portions SB2 arranged in the second direction DR2. The second sub-beading portions SB2 may have a bar shape elongated in the first direction DR1. As an example, FIG. 9 shows two second sub-beading portions SB2, but there may be at least two second sub-beading portions SB2. The printed circuit hoard 120 may be attached to the second sub-beading portions SB2 by double-sided tapes.

Figure 11:
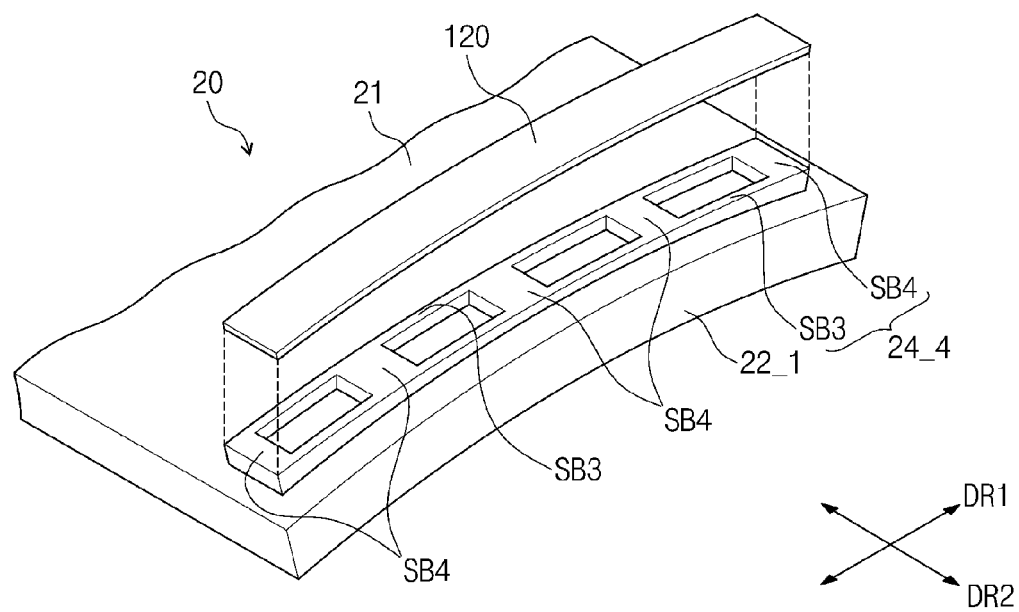

Referring to FIG. 11, a beading portion 24_4 includes a plurality of third sub-beading portions SB3 extending in the first direction DR1 and arranged in the second direction DR2 and a plurality of fourth sub-heading portions SB4 extending in the second direction DR2, arranged in the first direction DR1 and connected to the third sub-beading portions SB3. The third and fourth sub-beading portions SB3 and SB4 may be integrally formed with each other. For example, the third and fourth sub-beading portions SB3 and SB4 may be formed of a single continuous unit.

As an example, FIG. 11 shows two third sub-beading portions SB3 and five fourth sub-heading portions SB1, but the number of the third sub-beading portions SB3 and the number of the fourth sub-heading portions SB4 is not limited to the number depicted. The printed circuit board 120 may be attached to the third and fourth sub-beading portions SB3 and SB4 by a double-sided tape.

Figure 12:
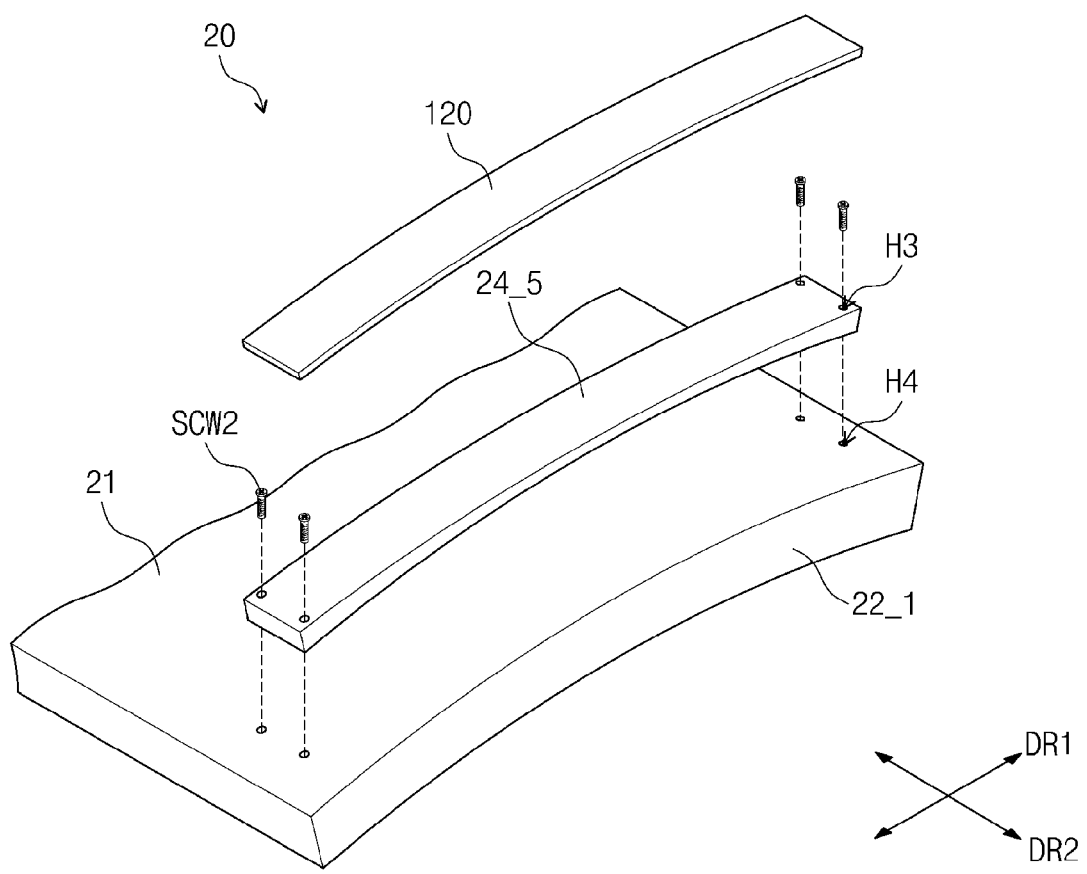

Referring to FIG. 12, a heading portion 24_5 may be formed separated from the first accommodating member 20 without being integrally formed with the first accommodating member 20. The beading portion 24_5 may include the same metal material as the first accommodating member 20, but it may be different from the first accommodating member 20. The beading portion 24_5 may alternatively be formed of a plastic material.

The display apparatus may include a plurality of second coupling members SCW2 to couple the heading portion 24_5 to the first accommodating member 20. The second coupling members SCW2 may be screws.

A plurality of third holes H3 is defined through predetermined areas of opposite side portions of the beading portion 24_5 with respect to the first direction DR1. A plurality of fourth holes H4 is defined through the bottom portion 21 of the first accommodating member 20 to overlap with the third holes H3. The second coupling members SCW2 are inserted into the third holes H3 and the fourth holes H4 to couple the beading portion 24_5 to the bottom portion 21 of the first accommodating member 20. The printed circuit board 120 may be attached to the beading portion 24_5 by a double-sided tape.

Figure 13:
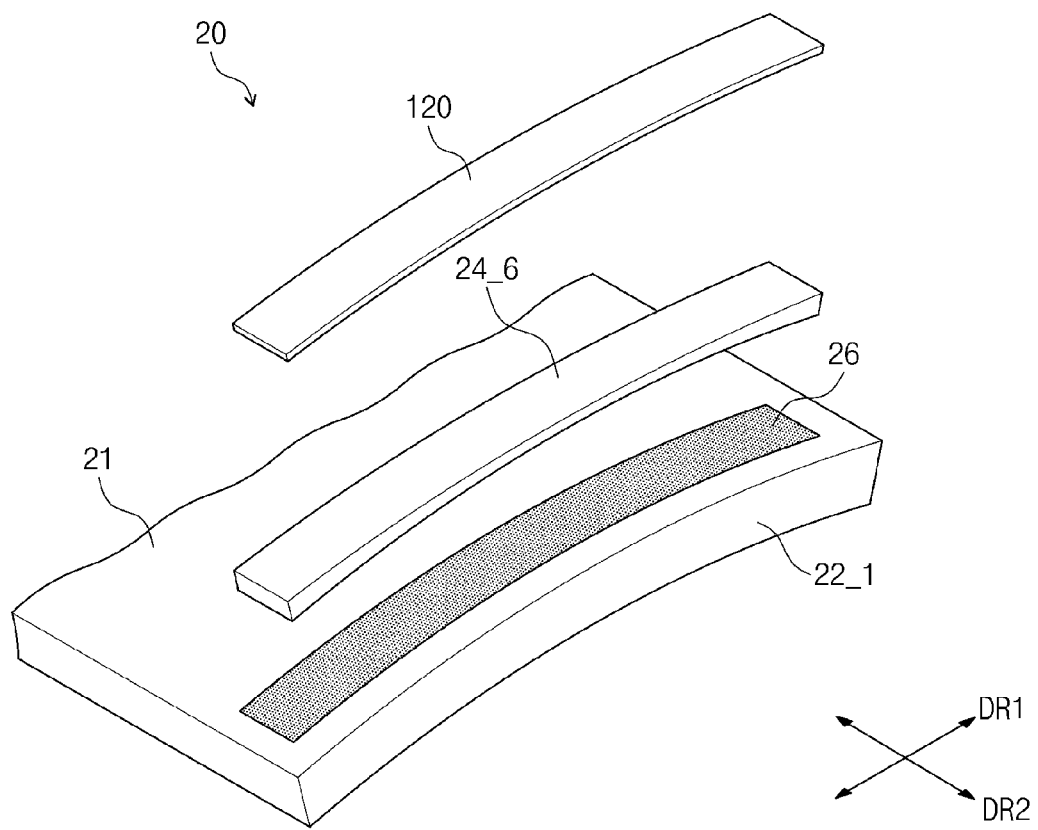

Referring to FIG. 13, a beading portion 24_6 may be formed separated from the first accommodating member 20 without being integrally formed with the first accommodating member 20. The display apparatus may include an adhesive member 26 to attach the beading portion 24_6 to the first accommodating member 20. The adhesive member 26 may be, but is not limited to, a double-sided tape. The beading portion 24_6 may be attached to the bottom portion 21 of the first accommodating portion 20 by the adhesive member 26. The printed circuit hoard 120 may be attached to the beading portion 24_6 by the double-sided tape.

Although the exemplary embodiments of the present invention have been described, it is understood that the present invention should not be limited to these exemplary embodiments but various changes and modifications can be made by one ordinary skilled in the art within the spirit and scope of the present invention.

What is claimed is:

1. A display apparatus comprising:
   a display panel being curved in a first direction with a first degree of curvature and arranged substantially along a second direction crossing the first direction;
   a first accommodating member receiving the display panel;
   a plurality of flexible circuit boards connected to one side portion of the display panel;
   a printed circuit board connected to the flexible circuit boards; and
   a raised portion disposed on a lower portion of the first accommodating member,
   wherein the printed circuit board is disposed on a lower portion of the raised portion, and a lower surface of the raised portion includes a curved surface that is curved in the first direction with a second degree of curvature that is smaller than the first degree of curvature.

2. The display apparatus of claim 1, wherein each of the plurality of flexible circuit boards are connected to the one side portion of the display panel, which is curved in the first direction, and the printed circuit board is curved in the first direction with the second degree of curvature and extends substantially in the second direction.

3. The display apparatus of claim 1, further comprising an adhesive member attaching the printed circuit board to the lower surface of the raised portion.

4. The display apparatus of claim 1, wherein an upper surface of the raised portion connected to a lower surface of the first accommodating member comprises a curved surface curved in the first direction with the first degree of curvature.

5. The display apparatus of claim 1, wherein the first accommodating member comprises:
   a bottom portion having a rectangular shape, curved in the first direction with the first degree of curvature, and extending substantially in the second direction; and
   sidewalls extending upward from side surfaces of the bottom portion, the display panel is disposed in a space defined by the bottom portion and the sidewalls, and the flexible circuit boards are bent along an outer side surface of a first sidewall adjacent to the one side portion of the display panel.

6. The display apparatus of claim 5, wherein the portion is protruded downward from a predetermined area of a lower surface of the raised portion adjacent to the first sidewall.

7. The display apparatus of claim 5, wherein the first accommodating member comprises a recess corresponding to the raised portion, and the recess is defined by recessing downwardly a predetermined area of an upper surface of the bottom portion.

8. The display apparatus of claim 1, farther comprising:
   a backlight unit disposed under the display panel, disposed in the first accommodating member, curved in the first direction with the first degree of curvature, extending substantially in the second direction, and providing a light to the display panel;
   a second accommodating member supporting an edge portion of the display panel; and
   a plurality of driving chips mounted on the flexible circuit boards to drive the display panel.

9. The display apparatus of claim 8, wherein the display panel comprises:
   a first substrate curved in the first direction with the first degree of curvature and extended substantially in the second direction;
   a second substrate facing the first substrate, curved in the first direction with the first degree of curvature, and extended substantially in the second direction; and
   a liquid crystal layer disposed between the first substrate and the second substrate, the second accommodating member supporting an edge portion of the first substrate, the first accommodating member surrounding an edge portion of the second accommodating member, and the flexible circuit boards connected to one side portion of the first substrate having a curved surface.

10. The display apparatus of claim 9, wherein the flexible circuit boards are bent along an upper surface of the second accommodating member adjacent to the first sidewall and an outer side surface of the first sidewall and are disposed under the bottom portion adjacent to the first sidewall.

11. The display apparatus of claim 1, wherein the raised portion is integrally formed with the first accommodating member.

12. The display apparatus of claim 1, wherein the display panel, the first accommodating member, and the raised portion are convexly and downwardly curved in the first direction with respect to a plane surface defined by the first direction and the second direction.

13. The display apparatus of claim 1, further comprising a plurality of first coupling members coupling the printed circuit board to the raised portion.

14. The display apparatus of claim 13, wherein the first coupling members are inserted into a plurality of first holes defined through the printed circuit board and a plurality of second holes defined in the raised portion coupling the printed circuit board to the raised portion.

15. The display apparatus of claim 1, wherein the raised portion comprises a plurality of first sub-raised portions arranged in the first direction.

16. The display apparatus of claim 1, wherein the raised portion comprises a plurality of second sub-raised portions extending in the first direction and arranged in the second direction.

17. The display apparatus of claim 1, wherein the raised portion comprises: a plurality of third sub-raised portions extending in the first direction and arranged in the second direction; and a plurality of fourth sub-raised portions extending in the second direction, arranged in the first direction, and connected to the third sub-raised portions.

18. The display apparatus of claim 1, further comprising a plurality of second coupling members coupling the raised portion to the lower portion of the first accommodating member.

19. The display apparatus of claim 18, wherein the second coupling members are inserted into a plurality of third holes defined through the raised portion and a plurality of fourth holes defined in the lower portion of the first accommodating member to couple the raised portion to the first accommodating member.

20. The display apparatus of claim 1, further comprising an adhesive member attaching the raised portion to the lower portion of the first accommodating member.

21. A display apparatus, comprising:
a curved display panel;
one or more flexible circuit boards disposed on the curved display panel;
a printed circuit board connected to the one or more flexible circuit boards and disposed under the curved display panel; and
a raised portion disposed between the curved display panel and the printed circuit board,
wherein the raised portion is curved on a first surface thereof to an extent that exceeds an extent to which a second surface thereof is curved, and
wherein the first surface faces the curved display panel and the second surface opposite to the first surface faces the print circuit board.

* * * * *